(12) United States Patent
Ostrovskyy et al.

(10) Patent No.: US 9,025,700 B2
(45) Date of Patent: May 5, 2015

(54) DIGITAL POLAR MODULATOR FOR A SWITCH MODE RF POWER AMPLIFIER

(75) Inventors: Pylyp Ostrovskyy, Frankfurt (DE); Johann Christoph Scheytt, Frankfurt (DE); Jae Ho Jung, Daejeon (KR); Bong Hyuk Park, Daejeon (KR); Sung Jun Lee, Daejeon (KR)

(73) Assignees: Electronics and Telecommunications Research Institute, Daejeon (KR); IHP GmbH—Innovations for High Performance Microelectronics/Leibniz-Institut für innovative Mikroelektronik, Frankfurt (DE)

( * ) Notice: Subject to any disclaimer, the term of this patent is extended or adjusted under 35 U.S.C. 154(b) by 0 days.

(21) Appl. No.: 14/365,885

(22) PCT Filed: Dec. 16, 2011

(86) PCT No.: PCT/EP2011/073118
§ 371 (c)(1),
(2), (4) Date: Jun. 16, 2014

(87) PCT Pub. No.: WO2013/087124
PCT Pub. Date: Jun. 20, 2013

(65) Prior Publication Data
US 2014/0307825 A1    Oct. 16, 2014

(51) Int. Cl.
*H04L 27/36*    (2006.01)
*H03F 3/217*    (2006.01)
(Continued)

(52) U.S. Cl.
CPC ............ *H04L 27/367* (2013.01); *H03F 3/2175* (2013.01); *H03M 3/404* (2013.01); *H04L 25/4927* (2013.01)

(58) Field of Classification Search
CPC ....................................................... H04L 27/36

USPC .................. 375/302, 356, 370, 371, 375, 376
See application file for complete search history.

(56) References Cited

U.S. PATENT DOCUMENTS

| | | | |
|---|---|---|---|
| 7,551,904 B2 | 6/2009 | Lee et al. | |
| 2003/0206056 A1* | 11/2003 | Hietala | 330/100 |

(Continued)

FOREIGN PATENT DOCUMENTS

| | | |
|---|---|---|
| KR | 1020060038134 A | 5/2006 |
| KR | 20110068605 A | 6/2011 |

OTHER PUBLICATIONS

M. Helaoui, et. al, "A Novel Architecture of Delta-Sigma Modulator Enabling All-Digital Multiband Multistandard RF Transmitters Design," IEEE Trans. Circuits and Syst. II: Exp. Briefs, vol. 55, No. 11, pp. 1129-1133, Nov. 2008.
(Continued)

*Primary Examiner* — Jaison Joseph
(74) *Attorney, Agent, or Firm* — William Park & Associates Ltd.

(57) ABSTRACT

A digital polar modulator (DPM) for transforming a baseband signal into a modulated digital modulator output signal comprises an input unit and two low-pass delta-sigma modulators, a first one being connected downstream from the first input part and configured to provide at its output a first pulse train in dependence on an amplitude- modulating baseband signal component, and a second one being connected downstream from the second input part and configured to provide at its output a multilevel quantized signal in dependence on a phase modulating baseband signal component; a multiphase generator, which is configured to provide a set of square-wave carrier signals having a common carrier frequency and exhibiting discrete phase shifts with respect to each other; a multiplexer, which is configured to provide a multiplexer output signal that is formed by switching, in dependence on a signal received at a select input as a function of time, between selected ones of the carrier signals; and a combiner unit.

16 Claims, 3 Drawing Sheets a)

b)

(51) Int. Cl.
*H03M 3/00* (2006.01)
*H04L 25/49* (2006.01)

(56) References Cited

U.S. PATENT DOCUMENTS

| | | | |
|---|---|---|---|
| 2005/0190854 A1* | 9/2005 | Shakeshaft et al. | 375/295 |
| 2006/0038710 A1* | 2/2006 | Staszewski et al. | 341/143 |
| 2006/0052124 A1* | 3/2006 | Pottenger et al. | 455/515 |
| 2006/0170505 A1* | 8/2006 | Humphreys et al. | 331/16 |
| 2006/0203922 A1* | 9/2006 | Rezeq | 375/247 |

OTHER PUBLICATIONS

M. Nielsen, T. Larsen, "A Transmitter Architecture Based on Delta-Sigma Modulation and Switch-Mode Power Amplification," IEEE Trans. Circuits and Syst. II, Exp. Briefs, vol. 54, No. 8, pp. 735-739, Aug. 2007.

Bassoo V et al: "Analysis of distortion in pulse modulation converters for switching radio frequency power amplifiers", Dec. 9, 2010, pp. 2088-2096.

Bassoo V et al: "Distortion arising from polar to PWM/PPM conversion in an all digital upconverter for switching rf power amplifier", Jun. 7, 2009, pp. 1533-1536.

Assoo V et al: "Potential Architecture for Future Generation 'Green' Wireless Base Station", Wireless Pervasive Computing, 2009. ISWPC 2009. Feb. 11, 2009, pp. 1-5.

Keyzer J et al: "Generation of RF Pulsewidth Modulated~", 2002 IEEE MTT-S International Microwave Symposium Digest, Jun. 2, 2002, pp. 397-400.

Parikh V K et al: "All Digital-Quadrature-Modulator Based Wideband Wireless Transmitters", IEEE Transactions on Circuits and Systems, Nov. 1, 2009, pp. 2487-2497.

Bjorn Thorsten Thiel et al: "Digital polyphase baseband for direct digital generation of high sample rate radio frequency signals", Jul. 18, 2010, pp. 1-4.

Bjorn Thorsten Thiel et al: "Digitally controlled pulse-width-pulse-position modulator in an 1.2V 65nm CMOS technology", Aug. 29, 2011, pp. 81-84.

Jack E. Volder, "The CORDIC Trigonometric Computing Technique", IRE Trans. Electron. Comput. EC-8:330-334 (1959).

* cited by examiner

- PRIOR ART -

- PRIOR ART -

DIGITAL POLAR MODULATOR FOR A SWITCH MODE RF POWER AMPLIFIER

The invention relates to a modulator for a high efficiency switch mode RF power amplifier (SMPA) in wireless or wired communications. It describes a fully digital modulation technique which deals with a conversion of the baseband amplitude and phase modulating signals into an RF modulated carrier with constant envelope resulting in a two-level pulse train that drives the input of an SMPA.

BACKGROUND OF THE INVENTION

FIG. 1 shows a transmitter system incorporating an SMPA. It uses an analogue upconverter which delivers modulated signal at the carrier frequency $f_C$ to the input of an RF modulator. The RF modulator performs a conversion of the input modulated signal with non-constant envelope to the two-level pulse train that drives the input of an SMPA. At the PA output a reconstruction bandpass filter suppresses the unwanted harmonics or broadband quantization noise of the digital bit stream, and delivers an amplified version of the original narrow-band input RF signal to the antenna.

The RF modulator is usually realized as a pulse-width modulator (PWM) or employs bandpass delta-sigma modulator (BDSM) techniques. In case of PWM, output pulses can be very short (maximum pulse width is $1/f_M$, where $f_M$ is the modulator sampling frequency) which requires high $f_T$ of a power device to process the signal without additional power losses. In case of DSM the minimum pulse length will be equal to $1/f_M$. Common BDSM architecture uses the sampling frequency four times higher than the input $f_M=4f_C$. Thus, if the system in FIG. 1 has to be built at 2 GHz then the $f_M$ will be 8 GHz. The resulting pulses are also too short to be efficiently processed by the state-of-the-art power devices.

FIG. 2 shows a transmitter system which is based on digital modulator. One of the possible realizations is described in detail in [M. Helaoui, et. al, "A Novel Architecture of Delta-Sigma Modulator Enabling All-Digital Multiband Multistandard RF Transmitters Design," IEEE Trans. Circuits and Syst. II: Exp. Briefs, vol. 55, no. 11, pp. 1129-1133, November 2008]. In this architecture, I and Q paths are processed separately by DSMs. Then they are upconverted to the needed carrier resulting in a two-level pulse train which drives following SMPA. The advantages of the system based on a digital modulator is that the transmitting system is reconfigurable; avoids A/D and/or D/A conversion; can use E/F/D/S PA classes to transmit non-constant envelope signals. The system in FIG. 2 produces the output pulse train with an average frequency of $f_C$, which is too high for existing power transistors if the operation at GHz carrier frequency is considered.

Another implementation of the modulator in the analogue domain including an upconversion function which decreases the average output frequency can be found in [M. Nielsen, T. Larsen, "A Transmitter Architecture Based on Delta-Sigma Modulation and Switch-Mode Power Amplification," IEEE Trans. Circuits and Syst. II, Exp. Briefs, vol. 54, no. 8, pp. 735-739, August 2007.]. This modulator processes the envelope amplitude and phase modulated carrier such a way that at the input of the SMPA only pulses with a width of $1/(2f_C)$ are occurred.

A fully digital modulator with decreased average output frequency and, possibly, with only $1/(2f_C)$ pulse widths in the output pulse train is highly demanded for the SMPA.

SUMMARY OF THE INVENTION AND OF ITS EMBODIMENTS

According to the present invention, a digital polar modulator for transforming a baseband signal into a modulated digital modulator output signal, the digital polar modulator comprises an input unit, which has a first input part that is configured to receive an amplitude modulating baseband signal component, and which has a second input part that is configured to receive a phase modulating baseband signal component;

two low-pass delta-sigma modulators, a first one being connected downstream from the first input part and configured to provide at its output a first pulse train in dependence on the amplitude-modulating baseband signal component, and a second one being connected downstream from the second input part and configured to provide at its output a multilevel quantized output in dependence on the phase modulating baseband signal component;

a multiphase generator, which is configured to provide at its output a set of square-wave carrier signals having a common carrier frequency and exhibiting discrete phase shifts with respect to each other;

a multiplexer, which is connected on its input side with the multiphase generator to receive in parallel the set of carrier signals, and which has a select input connected to the second delta-sigma modulator, and which is configured to provide a multiplexer output signal that is formed by switching, in dependence on the signal received at the select input as a function of time, between selected ones of the carrier signals;

and a combiner unit that is configured to provide at its output the digital modulator output signal as a combination of the multiplexer output signal and an output signal of the first delta-sigma modulator.

The fully digital polar modulator of the current invention improves the performance of the SMPA by reducing the average output frequency.

In the following, embodiments of the digital polar modulator are described. The additional features of the embodiments can be combined with each other to form further embodiments, unless explicitly described as forming alternative embodiments.

In the digital polar modulator of one embodiment, the first delta-sigma modulator has a drive input for receiving a drive signal determining a sampling frequency, and wherein the drive input is connected to the output of the multiplexer.

This embodiment may advantageously further comprise a divider unit, which is connected between the multiplexer and the first delta-sigma modulator and which is configured to provide to the drive input a drive signal that determines a sampling frequency forming a fraction of a frequency of the signal provided at the output of the multiplexer.

Another embodiment further comprises an encoder, which is connected downstream from the second delta-sigma modulator and upstream from the multiplexer, and which is configured to transform the multilevel quantized second delta-sigma output into the select signal with a width of N-bit, wherein N is selected such that $2^N$ represents a number of carrier signals provided by the multiphase generator.

In the digital polar modulator of this embodiment the second delta-sigma modulator is preferably configured to provide the multilevel quantized output as an output with the number of levels higher than $2^N$, wherein at least one level exceeding $2^N$ represents an extension of the second delta-sigma modulator input range.

In a further embodiment of the digital polar modulator, the combiner unit comprises at least one AND-gate connected on its input side with the multiplexer and the first delta-sigma modulator.

In an embodiment forming an alternative thereto, however, the multiplexer of the digital polar modulator additionally has an inverted output that provides an inverted multiplexer output signal forming an inverse of the multiplexer output signal, the combiner unit is configured to provide a differential three-level output signal. In this embodiment, the combiner unit preferably comprises a first AND-gate connected on its input side with the non-inverted multiplexer output providing the multiplexer output signal and with the first delta-sigma modulator, and a second AND-gate connected on its input side with the inverted output of the multiplexer and with the first delta-sigma modulator output.

A second aspect of the invention is formed by a transmitter, comprising a polar modulator according to the first aspect, or according to one of its embodiments.

The transmitter preferably further comprises power amplifier connected downstream from the digital polar modulator, and a bandpass filter connected downstream from the power amplifier.

The transmitter may further comprise a CORDIC unit, which is configured to receive a first signal component (I) and a quadrature second signal component (Q) and to provide to the first and second input parts of the digital polar modulator the amplitude and phase modulated signals, respectively. The CORDIC unit may be implemented as a digital signal processor (DSP).

Further embodiments are described in the claims and will, in the following, be described with reference to the enclosed Figures.

DETAILED DESCRIPTION OF EMBODIMENTS OF THE INVENTION

Figure 1:
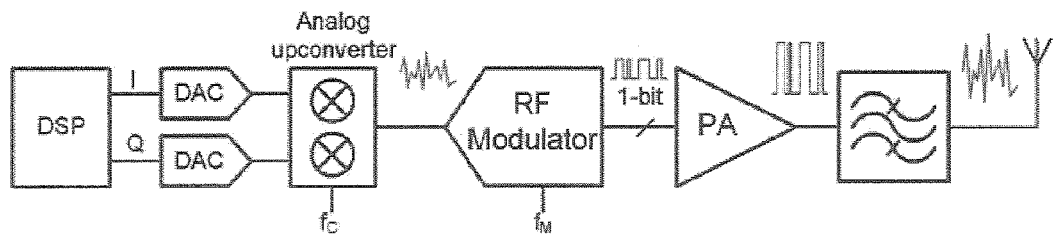
FIG. 1 shows a class-S PA with an RF modulator in accordance with the prior art.
Figure 2:
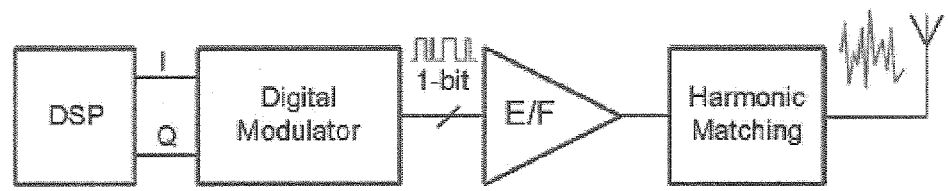
FIG. 2 shows a class E/F PA with a digital modulator in accordance with the prior art.
Figure 3:
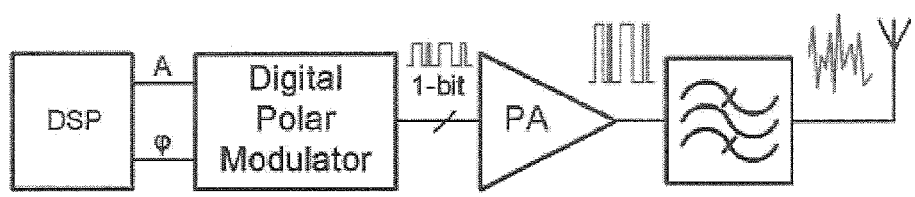
FIG. 3 shows a block diagram of an embodiment of an SMPA with a DPM in accordance with the invention.

FIG. 3 shows a block diagram of a transmitter system, which is based on a digital polar modulator (DPM). At the input of the DPM, amplitude and phase modulating signals are required. These signals can be calculated from I and Q signals in the baseband by means of a CORDIC algorithm [Jack E. Voider, The CORDIC Trigonometric Computing Technique, IRE Transactions on Electronic Computers, pp 330-334, September 1959] preserving the use of the conventional baseband transceiver. Then, processing amplitude and phase modulating signals independently, the DPM constructs an RF modulated carrier with constant envelope resulting in a two-level or three-level output pulse train that drives the input of an SMPA.

Figure 4:
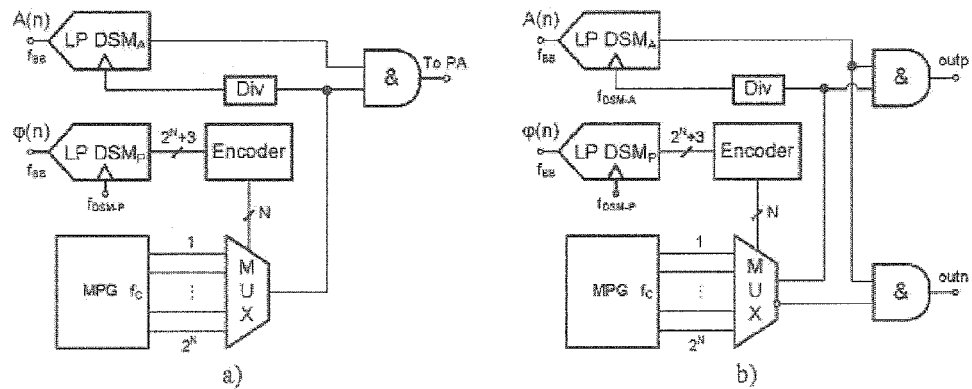
FIG. 4 shows a block diagram of a DPM architecture with a) two-level output; b) differential three-level output

The proposed DPM architecture is depicted in FIG. 4. A DPM in FIG. 4a can be used to drive single ended SMPA, whereas a DPM in FIG. 4b produces three-level differential output. The DPM has two low-pass delta-sigma modulators. The first one ($DSM_A$) is used to process an amplitude modulating signal and the second one ($DSM_P$) to process a phase modulating signal. A multi-phase generator (MPG) provides a set of square-wave carrier signals having a common carrier frequency and exhibiting discrete phase shifts with respect to each other. A multiplexer (MUX) has a select input which is controlled by the DSMP output. An AND gate combines both paths, resulting in a modulated carrier.

The target transmitted signal can be written as $$s_{TX}(t) = A(n) \cdot \sin(\omega_C t + \phi(n)) \tag{1}$$

where $A(n)$ and $\phi(n)$ are digital representations of the amplitude and phase of the carrier, respectively; $\omega_C$ is the carrier frequency.

The proposed modulator constructs a signal in the digital domain of a kind, which after amplification and bandpass filtering will result in the $s_{TX}(t)$ signal of equation (1). For this reason the signal according to (1) was split in two components, the amplitude envelope $A(n)$ and the square-wave signal with the frequency of $f_C$ modulated by the phase signal $\phi(n)$. Amplitude values $A(n)$ are converted in 1-bit pulse train by means of a low pass delta-sigma modulator $DSM_A$. The sampling frequency $f_{DSM-A}$ is taken from the MUX output, optionally divided by some number, in order to align pulse edges in the amplitude and phase paths. This relaxes the speed requirements for the power device. If the speed requirements are not critical, the sampling frequency $f_{DSM-A}$ can be applied independently and has to satisfy the following expression $f_{BB} \ll f_{DSM-A} \leq f_C$.

To construct a phase-modulated square-wave signal, the following approach is used. An MPG has to provide a set of square-wave carrier signals shifted by a discrete phase value, applied to the input of a multiplexer.

Figure 5:
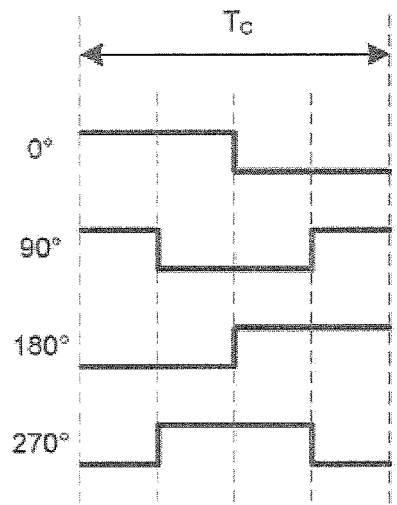
FIG. 5 shows a representation of an MPG output for four phases (N=2)

FIG. 5 shows an output of the MPG in case of 4 discrete phases. Depending on the number of the phases, the length of the MUX select signal is defined. If $2^N$ phases will be used then N-bit select signal has to be applied to the multiplexer.

The phase values $\phi(n)$ come to the low pass multi-level delta-sigma modulator $DSM_P$. The sampling frequency $f_{DSM-P}$ has to satisfy following expression $f_{BB} \ll f_{DSM-P} \leq f_C$. The select signal of the MUX is generated depending on the input phase values $\phi(n)$. This allows to switch between the square-wave carrier signals shifted by a discrete phase values and thus to approach to the carrier frequency with the original phase. For example, consider a DPM with 4 discrete phases in the MPG. If an input phase value $\phi(n)$ equals to 340 degrees, then the select signal of the MUX switches its output between the MPG signals corresponding to 270 and 0 degrees (FIG. 5) during a $1/f_{BB}$ time period.

The number of quantizer levels is equal to the number of carrier phases $2^N$ plus 1 to cover the phase range. A sufficient number of levels can be added in the quantizer of $DSM_P$ to extend the input range in order to avoid errors if overloading occurs. For example, one additional level extends the input range from the top and another one from the bottom. Thus, the modulator $DSM_P$ will have $2^N+3$ outputs. Then, an encoding has to be applied to provide an N-bit select signal from $2^N+3$ DSM outputs.

Figure 6:
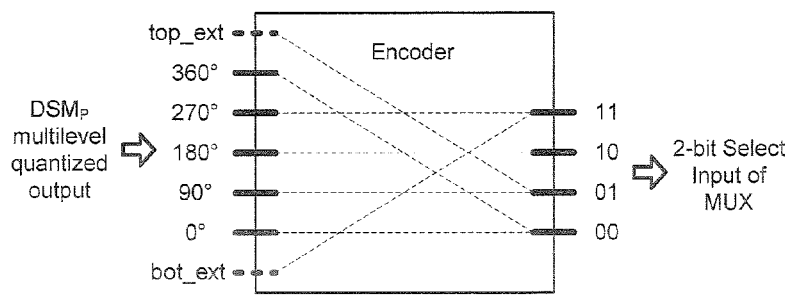
FIG. 6 shows an embodiment of an encoder for four phases (N=2)

Consider a DPM with four discrete phases in the MPG (N=2). An example of the encoder in this case is shown in FIG. 6. The number of encoder inputs $2^N+3=7$. The encoder output provides a 2-bit select signal for the multiplexer with the following states: 00, 01, 10, and 11, to switch between discrete carrier phases [0°, 90°, 180°, 270°] correspondingly.

Finally, the constructed phase-modulated square wave signal and the delta-sigma modulated amplitude values are combined by means of the AND-gate resulting in a two-level or three level signal. After amplification and bandpass filtering at carrier frequency, the targeted signal $s_{TX}(t)$ is obtained.

Figure 7:
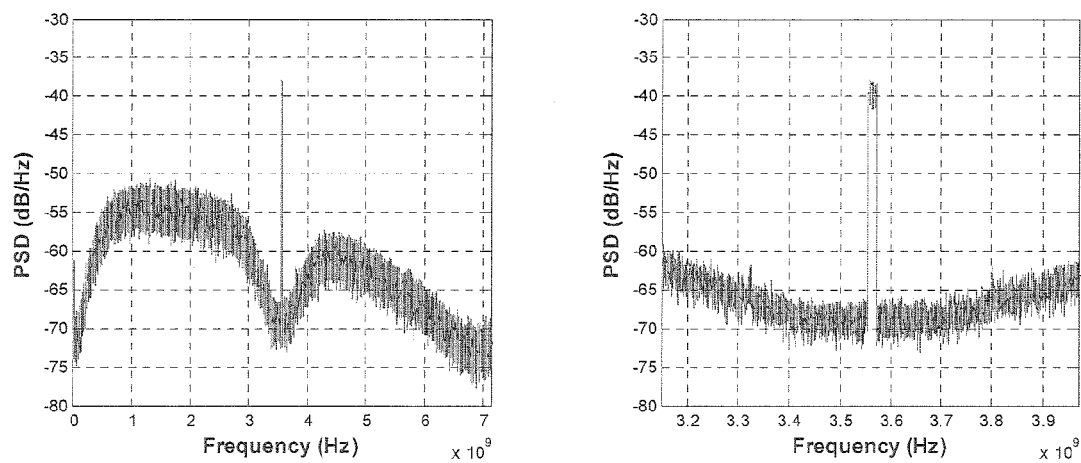
FIG. 7 shows simulated output spectrums of a 20 MHz LTE signal at 3.56 GHz carrier frequency.

FIG. 7 shows the simulated output spectrums of the 20 MHz LTE signal at 3.56 GHz carrier. The simulation results correspond to a DPM that is based on an architecture depicted in FIG. 4a when the MPG provides 8 phases.

The invention claimed is:

1. A digital polar modulator (DPM) for transforming a baseband signal into a modulated digital modulator output signal, the digital polar modulator comprising
    an input unit, which has a first input part that is configured to receive an amplitude modulating baseband signal component, and which has a second input part that is configured to receive a phase modulating baseband signal component;
    two low-pass delta-sigma modulators, a first one being connected downstream from the first input part and configured to provide at its output a first pulse train in dependence on the amplitude-modulating baseband signal component, and a second one being connected downstream from the second input part and configured to provide at its output a multilevel quantized signal in dependence on the phase modulating baseband signal component;
    a multiphase generator, which is configured to provide at its output a set of square-wave carrier signals having a common carrier frequency and exhibiting discrete phase shifts with respect to each other;
    a multiplexer, which is connected on its input side with the multiphase generator to receive in parallel the set of carrier signals, and which has a select input connected to the second delta-sigma modulator, and which is configured to provide a multiplexer output signal that is formed by switching, in dependence on the signal received at the select input as a function of time, between selected ones of the carrier signals;
    and a combiner unit that is configured to provide at its output the digital modulator output signal as a combination of the multiplexer output signal and an output signal of the first delta-sigma modulator.

2. A digital polar modulator for generating a modulated digital modulator output signal used to drive a switch mode RF power amplifier (SMPA), the digital polar modulator comprising:
    a first low-pass delta-sigma modulator that is configured to generate a first pulse train generated by delta-sigma modulating an amplitude of a baseband signal, and to output the first pulse train;
    a second low-pass delta-sigma modulator that is configured to generate a multilevel quantized signal generated by delta-sigma modulating a phase of a baseband signal, and to output the multilevel quantized signal;
    a multiplexer that is configured to select a multiplexer output signal among a plurality of carrier signals shifted by a plurality of discrete phase using the multilevel quantized signal; and
    a combiner unit that is configured to generate the digital modulator output signal using the multiplexer output signal and first pulse train.

3. The digital polar modulator of claim 2, wherein the first low-pass delta-sigma modulator has a drive input for receiving a drive signal dependent on the multiplexer output signal, and a sampling frequency is determined according to the drive signal.

4. The digital polar modulator of claim 3, further comprising a divider unit that is configured to generate the drive signal by forming a fraction of a frequency of the multiplexer output signal, and to output the drive signal to the first low-pass delta-sigma modulator.

5. The digital polar modulator of claim 2, further comprising a multiphase generator that is configured to generate the plurality of carrier signals, and to output the plurality of carrier signals to the multiplexer.

6. The digital polar modulator of claim 2, further comprising an encoder that is configured to convert the multilevel quantized signal into an N-bit select signal, wherein $2^N$ represents a number of the carrier signals outputted by the multiphase generator.

7. The digital polar modulator of claim 6, wherein the multiplexer selects the multiplexer output signal which is dependent on the N-bit select signal.

8. The digital polar modulator of claim 2, wherein the second low-pass delta-sigma modulator is configured to provide a multilevel quantized output with the number of levels higher than $2^N$, wherein at least one level represents an extension of an input range of the second low-pass delta-sigma modulator.

9. The digital polar modulator of claim 2, wherein the combiner unit comprises at least one AND-gate connected on its input side with the multiplexer and the first delta-sigma modulator.

10. The digital polar modulator of claim 2, wherein the multiplexer has a non-inverted output providing the multiplexer output signal, and an inverted output that provides an inverted multiplexer output signal forming an inverse of the multiplexer output signal, and
    wherein the combiner unit is configured to provide a differential three-level output signal.

11. The digital polar modulator of claim 10, wherein the combiner unit comprises:
    a first AND-gate connected on its input side with the non-inverted output of the multiplexer and with the first delta-sigma modulator, and a second AND-gate connected on its input side with the inverted output of the multiplexer and with the first delta-sigma modulator.

12. A digital polar modulating method for generating a modulated digital modulator output signal used to drive a switch mode RF power amplifier (SMPA), the digital polar modulating method comprising:
    generating a first pulse train by delta-sigma modulating an amplitude of a baseband signal;
    generating a multilevel quantized signal by delta-sigma modulating a phase of a baseband signal;
    selecting a multiplexer output signal among a plurality of carrier signals shifted by a plurality of discrete phase using the multilevel quantized signal;
    and
    generating the digital modulator output signal using the multiplexer output signal and first pulse train.

13. The digital polar modulating method of claim 12, wherein the generating of a first pulse train comprises outputting the first pulse train according to a sampling frequency determined depending on the multiplexer output signal.

14. The digital polar modulating method of claim 12, wherein the selecting of a multiplexer output signal comprises:
- converting the multilevel quantized signal into an N-bit select signal, and
- selecting the multiplexer output signal in dependence on the N-bit select signal,
- wherein $2^N$ represents a number of the plurality of carrier signals.

15. The digital polar modulating method of claim 12, wherein generating the digital modulator output signal comprises performing an AND operation on the multiplexer output signal and the first pulse train.

16. The digital polar modulating method of claim 12, wherein generating the digital modulator output signal comprises:
- performing an AND operation on a non-inverted output signal corresponding to the multiplexer output signal and the first pulse train, and performing an AND operation on an inverted output signal corresponding to an inverse of the multiplexer output signal and first pulse train.

\* \* \* \* \*